United States Patent [19]
Grabbe

[11] Patent Number: 4,873,615
[45] Date of Patent: Oct. 10, 1989

[54] SEMICONDUCTOR CHIP CARRIER SYSTEM

[75] Inventor: Dimitry G. Grabbe, Middletown, Pa.

[73] Assignee: AMP Incorporated, Harrisburg, Pa.

[21] Appl. No.: 100,151

[22] Filed: Sep. 23, 1987

Related U.S. Application Data

[63] Continuation-in-part of Ser. No. 916,974, Oct. 9, 1986, abandoned.

[51] Int. Cl.$^4$ ............................................. H05K 1/14
[52] U.S. Cl. ........................... 361/395; 174/52.4; 357/80; 357/81; 361/386; 361/398
[58] Field of Search ............ 174/52 FP, 525, 16 HS; 357/68, 72, 74, 80, 81; 361/386–389, 394, 398, 400, 401, 405–406; 339/17 C, 17 CF; 165/185, 80.3

[56] References Cited

U.S. PATENT DOCUMENTS

| | | | |
|---|---|---|---|
| 3,519,890 | 7/1970 | Ashby | 361/408 |
| 4,089,575 | 5/1978 | Grabbe | 339/17 CF |
| 4,116,519 | 9/1978 | Grabbe | 339/17 CF |
| 4,278,311 | 7/1981 | Scheingold et al. | 339/17 CF |
| 4,362,902 | 12/1982 | Grabbe | 174/52 FP |
| 4,408,218 | 10/1983 | Grabbe | 357/70 |
| 4,410,905 | 10/1983 | Grabbe | 357/80 |
| 4,410,906 | 10/1983 | Grabbe | 357/80 |
| 4,417,266 | 11/1983 | Grabbe | 357/80 |
| 4,419,818 | 12/1983 | Grabbe | 29/832 |
| 4,420,203 | 12/1983 | Aug et al. | 339/17 CF |
| 4,426,769 | 1/1984 | Grabbe | 29/588 |
| 4,445,271 | 5/1984 | Grabbe | 29/589 |
| 4,447,857 | 5/1984 | Marks et al. | 361/395 |
| 4,449,770 | 5/1984 | Grabbe | 339/17 CF |
| 4,480,288 | 10/1984 | Gazdik et al. | 361/398 |
| 4,506,826 | 12/1985 | Burns et al. | 174/52 FP |
| 4,513,353 | 4/1985 | Bakermans et al. | 361/399 |
| 4,551,789 | 11/1985 | Schettler et al. | 361/406 |
| 4,587,548 | 5/1986 | Grabbe | 357/70 |
| 4,598,308 | 7/1986 | James et al. | 361/401 |

FOREIGN PATENT DOCUMENTS 2516007 11/1975 Fed. Rep. of Germany ...... 361/388
2352480 12/1977 France ............................... 174/52 FP

OTHER PUBLICATIONS

McBride, "Multifunction Plug for IC Package", IBM Technical Disclosure Bulletin, vol. 21, No. 9, Feb. 1979, pp. 3594–5.

DeBoskey, "Directly Attached Integrated Circuit Lead Frame", IBM Technical Disclosure Bulletin, vol. 15, No. 1, Jun. 1972, p. 307.

Primary Examiner—Gregory D. Thompson
Attorney, Agent, or Firm—Bruce J. Wolstoncroft

[57] ABSTRACT

An integrated circuit semiconductor chip carrier system (10) which provides reliable interconnection of one or more semiconductor chips (13) to external circuitry in environments of variable temperature and stress. The system (10) includes a housing (11), one or more semiconductor chips (13) mounted on a substrate (12), and a plurality of electrical terminals (36) which extend through one or more walls (21, 22, 23, 24) of the housing (11). Each terminal (36) having an inner resilient portion (36b) which is adapted to be electrically connected to a contact pad (32) which is in electrical engagement with a semiconductor chip (13) on the substrate (12). The inner resilient portions (36b) being directly connected to the pads (32) in such a manner so that as the substrate (12) expands and contracts according to temperature variations, the inner resilient portions (36b) move accordingly, thereby eliminating harmful stresses which results in "bi-metal effect". A non-conductive, flexible, electrical interconnection member (76) is also provided for electrically connecting the semiconductor chips (13) of the substrate (12) to a plurality of terminals (36). The interconnection member (76) is attached to the substrate (12) in only a very few locations enabling the interconnection member (76) to be restrained in lateral movement while permitting the contact pads (78) of the interconnection member (76) to flex and deform freely relative to the substrate (12) and the semiconductor chips (13) as a result of temperature variations.

6 Claims, 3 Drawing Sheets

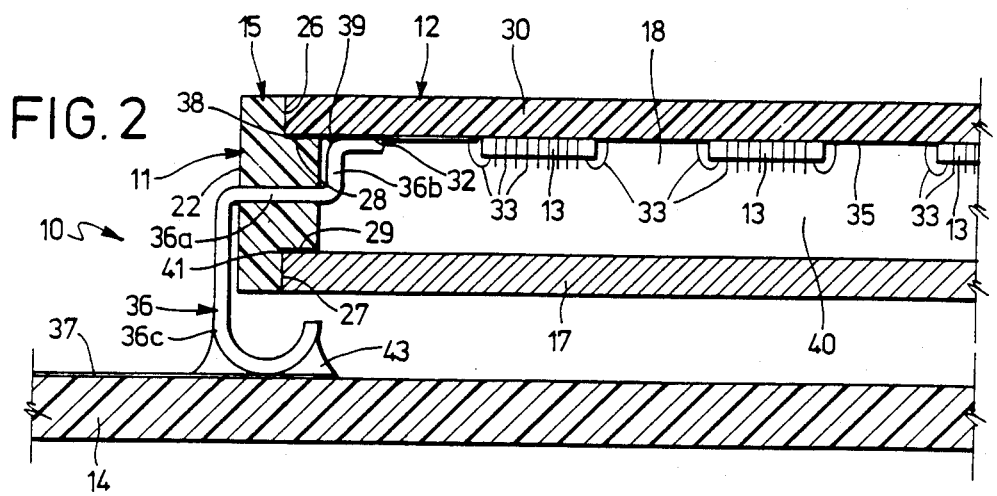
FIG. 2
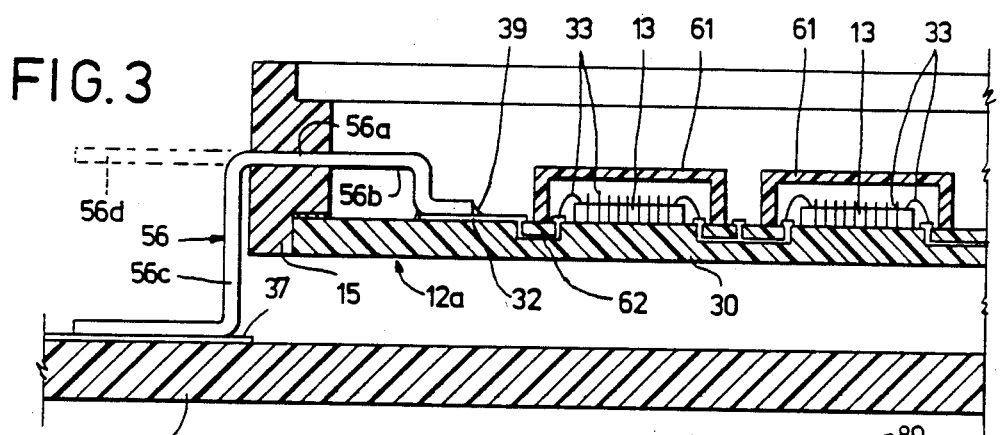
FIG. 3
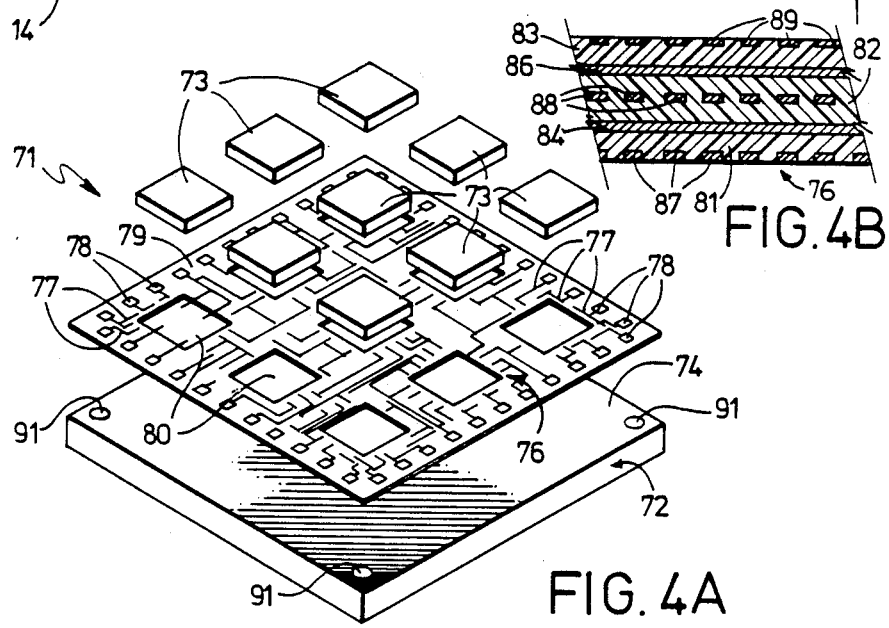
FIG. 4A
FIG. 4B

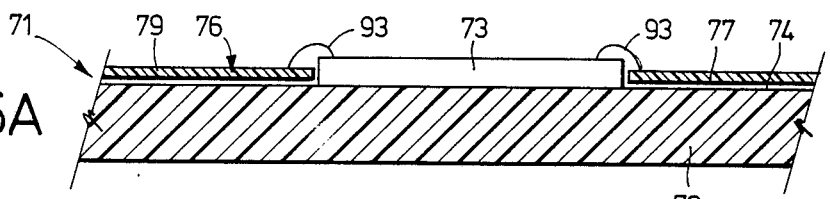
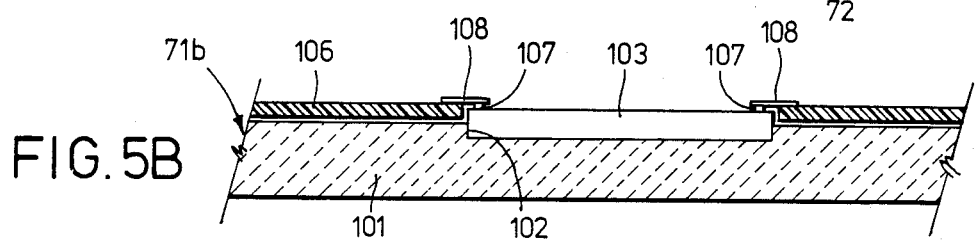
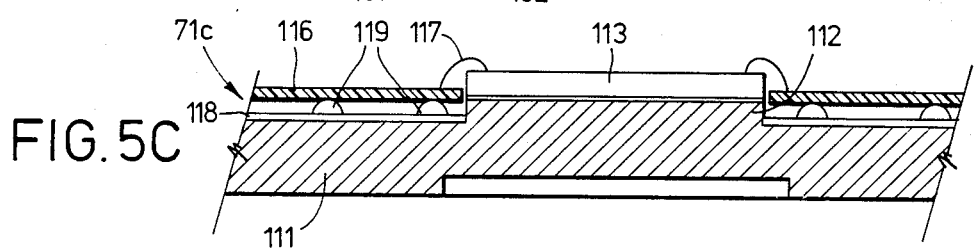

SEMICONDUCTOR CHIP CARRIER SYSTEM

COPENDING APPLICATION

This application is a continuation-in-part of copending patent application Ser. No. 916,974 filed October 9, 1986, now abandoned.

FIELD OF THE INVENTION

This invention relates to semiconductor chip carrier systems and, in particular, to semiconductor chip carrier systems capable of reliably electrically connecting semiconductor chips to external circuitry in environments of variable temperature and stress.

BACKGROUND OF THE INVENTION

Due to their small size and fragile nature, integrated circuit semiconductor chips are commonly packaged in integrated circuit chip carriers. A chip carrier typically comprises a substrate of ceramic or other rigid insulating material having an integrated circuit chip mounted thereon and containing a plurality of conductors which extend from adjacent the chip to the periphery of the substrate where they are terminated by enlarged contact areas or contact pads.

Frequently, a multi-chip carrier substrate is incorporated within a frame or housing which protects and supports the multi-chip carrier substrate and the chips thereon, and provides a connector to electrically connect the substrate to a printed circuit board or other external circuitry. Generally, the frame or housing contains a plurality of leads. One end of each of the leads extends into the housing to be electrically connected to one of the contact pads on the substrate, and the opposite end of each of the leads extends out of the housing to be connected to contacts on the printed circuit board either directly or through a socket connector.

In the past, integrated circuit semiconductor chip carrier systems have been characterized by including rigid housing structures which included glass seals to seal between the housing and the leads extending therethrough to hermetically seal the housing. The housing structures provided in the prior art have been used as structural members which were not designed with any non-rigid characteristics. In other words, the housing was made of rigid plastic which not only supported the leads, but also provided the structure to support the substrate. Such systems have not been fully satisfactory due to difficulty in maintaining the hermetic seal as the chip carrier and substrate are exposed to various temperature. As result of variations in thermal expansion and contraction of the rigid housing components, the hermetic seal of the frame was lost. Another problem with the chip carriers of the prior art was due to very high cost of such structures. Prior semiconductor chip carrier systems have also included substrates of ceramic or other such non-flexible materials on which the semiconductor chips were mounted. The ceramic substrates were provided with conductors embedded within the substrates (multi-layer co-fired ceramic substrates), or built up layer by layer on a surface of the substrates (thin or thick-film ceramic substrates). In some instances, the conductors were incorporated into films deposited uniformly on a surface of the substrates. Electrical connection from the chip to the conductors of the substrate, and from the conductors of the substrate to the housing leads, was made by thin gold or aluminum bond wires to compensate for variations in thermal expansion and contraction and physical distortion of the various components of the system, and to provide connections between the semiconductor chips and the substrate. Such connections, however, are expensive to fabricate and have not proven to be entirely satisfactory.

Many prior semiconductor multichip carrier systems were also limited in size. In particular, prior processes for manufacturing ceramic substrates were generally unable to produce sufficiently flat substrates in sizes larger than about two inches by two inches due to the difficulties of maintaining dimensional stability of the ceramic during firing. The quality of the surface finish on prior ceramic substrates was also such that high-density, thin-film interconnects were not possible on the substrate.

SUMMARY OF THE INVENTION

The invention provides an integrated circuit semiconductor chip carrier system that is inexpensive to manufacture, easy to use, and that provides reliable interconnection of one or more semiconductor chips to external circuitry in environments of variable temperature and stress. The systems of the invention include conductor means which, except for small portions interfacing the system housing, are substantially entirely non-rigid and flexible. The preferred embodiment of the invention includes a substantially non-rigid housing, one or more semiconductor chips on a substrate, and a plurality of flexible conductor means, including first portions carried by one or more walls of the housing and having substantially non-rigid and compliant portions which extend inwardly from the housing for connection to the substrate and outwardly to external circuitry. The flexible conductor means may be as many as 1800 in number or more and be spaced as close as 0.010 inches apart.

Interconnection between the chips on the substrate can be made in the traditional means such as a thick film, thin film, co-fired and plated conductors. The interconnection can also be made by new means, where the chip-to-chip interconnecting member is made from organic material containing thin flexible conductors disposed in at least one layer, and in some cases, as many as forty-five layers, arranged in a "microstrip" or "stripline" manner. In all cases a window is provided for the integrated circuit in the interconnection member. The interconnection member is not attached to the substrate over all area, but only in some points, permitting the substrate and the interconnection member to expand or contract independent of each other as a result of temperature change according to the respective co-efficient of expansion of each. This eliminates harmful interference on coupling generally referred to as a "bi-metal" effect. The present invention can thus provide electrical connections that eliminates otherwise unavoidable strain and stress of the system.

In a preferred embodiment, the semiconductor chip carrier system includes a housing of generally rectangular shape having a plurality of leads extending through one or more peripheral walls. The leads each include a central portion embedded in the housing walls, an outer compliant portion extending outside the housing and adapted to be electrically connected to external circuitry, and an inner compliant portion which is adapted to be electrically connected to a contact pad on a chip carrier substrate incorporated within the housing. The chip carrier substrate is formed from a rigid material such as ceramic or metal which is adapted to carry a plurality of semiconductor chips disposed in chip carriers that are electrically mounted thereon. The chip carrier substrate is nested in the walls of the housing. An electrical interconnection member, preferably comprising a thin, flexible, plastic film, contains and supports a plurality of flexible conductors for electrically interconnecting the plurality of chips, and for connecting the pads positioned around the periphery of the film to the inner leads of the frame. The film is mechanically retained in some spots to restrict lateral movement of the film relative to the substrate but is generally detached from the substrate over substantially its entire area to permit the film and the substrate to flex and distort independently of one another.

Because the leads are supported by the non-rigid housing and the conductors of the chip carrier are substantially non-rigid and compliant, the system is capable of accommodating deformations of the components caused by temperature variations and other stresses, intermediate wire bond connections between the leads and the flexible conductors of the film and between the substrate edge pads and frame leads, can be eliminated. In many embodiments of the invention, the leads can be directly connected to the contact pads on the chip carrier substrate; and the terminal areas on the chips can be connected to the film conductors by more efficient tape-automated bonding techniques, as well as with the standard wire bonds.

The system provides an enclosed housing which may be partially filled with a protective jelly-like compound to protect the integrated circuit from moisture as well as providing other environmental protection of the chips. The housing opposite the chip carrier substrate can be closed by a cover of metal or other material to provide structural protection.

In the present invention, the electrical interconnection member of the chip carrier substrate can be substantially separate from the rigid substrate. Accordingly, tremendous flexibility is provided in designing the chip carrier to maximize the structural and thermal characteristics of the rigid substrate for particular applications and, at the same time, to optimize transmission line properties of the conductors. For example, with the present invention, the rigid substrate can be constructed of metal or other materials having high thermal conductivity when desired for a particular application. In addition, because the electrical interconnection member can be separate from the chip supporting structure of the chip carrier substrate, non-flat or warped surfaces can be tolerated on the interconnection member; and the substrate can thus be made in much larger sizes, for example, six inches by six inches or more, and be capable of accommodating many semiconductor chips on a single chip carrier substrate. Also, by incorporating the conductors within a multi-layer, flexible film, a significantly greater density of conductors can be achieved than in prior systems to provide the multiplicity of necessary electrical connections for the chips. As many as 600 channels or more may be required per square inch of the substrate.

In one embodiment of the invention, ceramic substrates are manufactured with a plurality of cavities within which the integrated circuit semiconductor chips are mounted. Such a construction permits the use of shorter wires or tapeautomated bonding techniques to connect the terminal areas of the chips to the conductors on the chip carrier substrate, thus reducing electrical resistance and inductance and increasing system reliability. The interconnection member can be configured so as to provide leads extending into the windows at the interconnecting member and permit sending of such leads directly to the chips, eliminating the need for the intermediate connection of TAB (Tape Automated Bonding) or wire bond. In another embodiment of the invention, the chip carrier substrate can be formed of metal. The chips can be mounted on pedestals formed on the metal substrate for more accurate positioning of the chips on the substrate.

In the invention, the individual semiconductor chips can be mounted to the chip carrier substrate by a variety of techniques. For example, the chips can be mounted to the substrate using "flip chip" mounting structure as well as modular, spring-mounting structure to provide even greater flexibility in chip carrier design. Such mounting techniques can be used on ceramic substrates having a dielectric constant between 1 and 6 and which have better than a five-microinch surface finish in an "as-fired" condition to support plural layers of an organic compound thereon capable of providing the necessary interconnecting network between a plurality of chips supported on the substrate.

Further advantages and details of the invention are set out more fully hereinafter in conjunction with the following detailed description of presently preferred embodiments.

BRIEF DESCRIPTION OF THE DRAWINGS

An embodiment of the invention will now be described by way of example with reference to the accompanying drawings, in which:

FIG. 2 is a cross-sectional view of a portion of the system of FIG. 1 in assembled form;

FIG. 3 is a cross-sectional view illustrating alternative embodiments of the semiconductor chip carrier system of the invention;

FIG. 4A is an exploded perspective view of the chip carrier system of a preferred embodiment of the invention;

FIG. 4B is a greatly enlarged, cross-sectional view of the flexible film interconnection member of FIG. 4A;

FIG. 5A is a cross-sectional view of a portion of the chip carrier of FIGS. 4A and 4B in assembled form;

FIGS. 5B and 5C are cross-sectional views illustrating alternative embodiments of a chip carrier system of the invention.

DETAILED DESCRIPTION OF THE INVENTION

Figure 1:
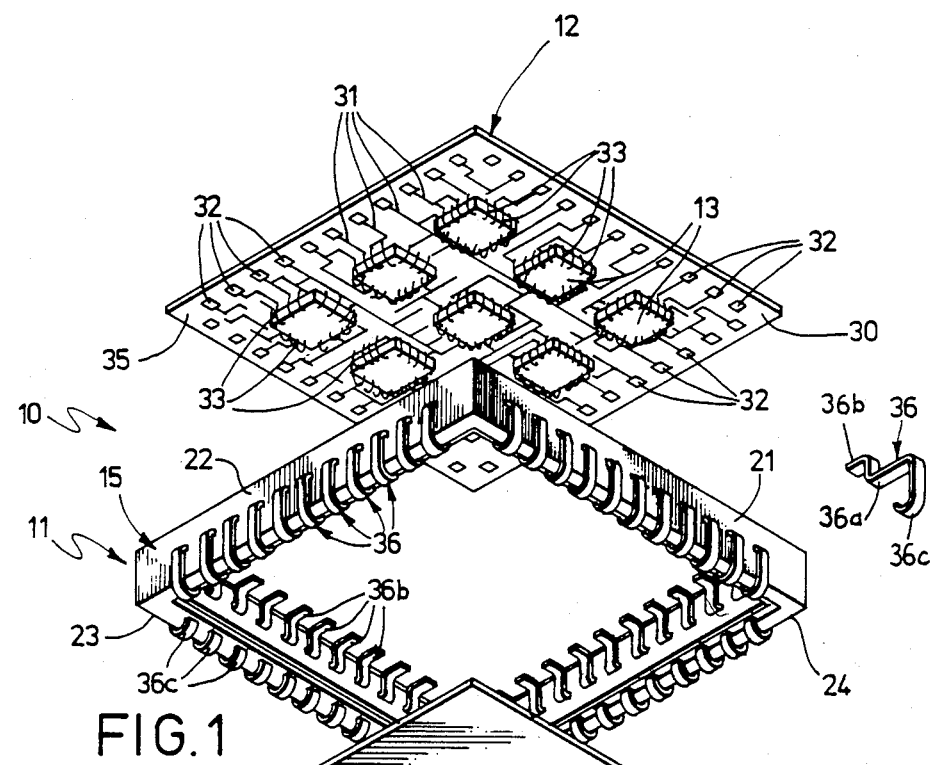
FIG. 1 is an exploded perspective view of a semiconductor chip carrier system of the invention and a printed circuit board to which the system is to be mounted.

FIGS. 1 and 2 illustrate a preferred embodiment of the semiconductor chip carrier system of the invention. The system is generally designated by reference numeral 10 and comprises a housing 11 which incorporates a chip carrier substrate 12 having a plurality of integrated circuit, semiconductor chips 13 mounted thereon. Housing 11 protects chip carrier substrate 12 and chips 13 thereon, and electrically connects chips 13 on chip carrier substrate 12 to external circuitry such as a printed circuit board 14.

Housing 11 comprises a box-like structure of generally square or rectangular shape and includes a substantially non-rigid peripheral frame 15 defining sidewalls 21, 22, 23, and 24; a top wall defined by chip carrier substrate 12; and a bottom wall defined by a cover plate 17. When assembled, the walls of the housing define an enclosed chamber 18 as shown in FIG. 2. Frame 15 is preferably formed of a moldable plastic that has pliant characteristics (a liquid crystal polymer is particularly suitable) and is shaped to define upper and lower recesses 26 and 27 (FIG. 2) for receiving chip carrier substrate 12 and cover plate 17, respectively. The configuration of frame 15 allows the frame to be smaller than frames of the prior art and require less material. This is important as space becomes increasingly valuable in certain applications. It should be noted that although chip carrier substrate 12 is shown in FIG. 2 as defining the top wall, it is also conceivable and likely that chip carrier substrate 12 and cover plate 17 will be reversed as shown in FIG. 3 with chip carrier substrate 12 defining the bottom wall and cover plate 17 defining the top wall.

Chip carrier substrate 12, which is described in detail below, comprises a substrate 30 consisting of a flat, relatively thin plate of a rigid material such as, but not limited to, ceramic. A plurality of integrated circuit semiconductor chips 13 is mounted to a surface 35 of substrate 30 in a manner known to those skilled in the art. However, other mounting structures may be used as described below.

Chip carrier substrate 12 also includes a plurality of conductors 31 (FIG. 1) for connecting the plurality of chips 13 to one another and to a plurality of contact pads 32 positioned adjacent the periphery of chip carrier substrate 12. As is known to those skilled in the art, conductors 31 can be embedded within substrate 30 (multi-layer, co-fired ceramic substrate), or built up layer by layer on surface 35 of substrate 30 (thin- or thick-film ceramic substrate). The terminal areas on semiconductor chips 13 can be connected to the conductors 31 by gold wire tape or tapelike bonds 33.

A plurality of conductive leads or terminals 36 are supported by frame 15. Leads 36 are substantially spaced around the periphery of frame 15 and comprise ribbon-like members formed of a flexible metal such as a copper alloy. As many as 1800 or more leads can thus be used spaced as close as 0.010 inches apart. As shown in FIG. 2, each lead 36 includes a central portion 36a extending through and supported by frame 15, an inner portion 36b extending into housing 11, and an outer portion 36c extending outside housing 11. Leads 36 are preferably secured to frame 15 by molding frame 15 around the lead central portions 36a. It should be noted that non-rigid frame 15 accurately positions leads 36 so that leads 36 will electrically engage terminal areas of chips. However, substantially non-rigid frame 15 does not mechanically support the housing in the same way as the prior art carriers, which is illustrated in French Pat. No. 2,352,480.

Inner lead portions 36b protrude inwardly from frame 15 for a distance and are curved to define compliant beams which are directly connected to contact pads 32 on chip carrier substrate 12. The ends of lead portions 36b are positioned to be substantially coplanar where they contact the pads 32. Outer lead portions 36c protrude outwardly from frame 15 and are configured to be directly connected to contact pads 37 (see FIG. 2) on printed circuit board 14. In the embodiment of FIGS. 1 and 2, lead portions 36c have a "J"-leg configuration, although other configurations can be employed as illustrated, for example, in FIG. 3.

To assemble system 10, chip carrier substrate 12, having semiconductor chips 13 mounted thereon and conductors 31 provided thereon, is positioned in recess 26 of frame 15. Chip carrier substrate 12 is then secured to frame 15 by an appropriate adhesive 38 applied between the chip carrier substrate and the ledge 28, thereby providing the mechanical support required to maintain the substantially non-rigid frame 15 in position.

Upon mounting of chip carrier substrate 12 to frame 15, contact pads 32 will be aligned with and in contact with the coplanar ends of inner portions 36b of leads 36. The ends of each of lead inner portions 36b are then attached to aligned contact pads 32 by thermo-compression bonding, soldering, brazing, or other suitable procedure. A solder connection is illustrated in FIG. 2 at 39. Due to the non-rigid, compliant nature of frame 15 and lead portions 36b, the leads can be directly attached to contact pads 32 without the use of intermediate connections. Consequently, any distortion or warpage of chip carrier substrate 12 caused by thermal expansion and contraction or mechanical stresses are accommodated by the resilience of frame 15 and lead inner portions 36b, thereby insuring that a reliable connection is maintained between leads 36 and contact pads 32.

The partially assembled housing is then turned over, and chamber 18 may be partially or completely filled with a compound such as for example but not limited to polydimethylsiloxine (illustrated schematically at 40 in FIG. 2) to provide moisture and environmental protection for chip carrier 12 and the semiconductor chips. Cover 17 of metal or other material is then mounted within recess 27 of frame 15 and secured thereto by applying an adhesive between cover 17 and ledge 29 as shown at 41, or retained mechanically.

When assembled, housing 11 comprises a fully enclosed container which can reliably protect chip carrier substrate 12 and environmentally vulnerable semiconductor chips 13 thereon without the need of a hermetic seal. The pliant nature of frame 15 and leads 36 permits the housing and leads to flex and bend in a limited manner without breaking or cracking, thereby allowing the integrity of the housing to be maintained under thermal and mechanical stress.

Following assembly, system 10 can be connected to a printed circuit board 14 or other external circuitry for testing or use. As shown in FIG. 2, the external portions 36c of the leads 36 can be positioned on contact pads 37 on the printed circuit board 14 and directly attached thereto by a conductive solder 43 to electrically connect the chip carrier substrate 12 and the semiconductor chips 13 thereon to the printed circuit board.

FIG. 3 illustrates several alternative embodiments of the invention. For example, in FIG. 3, the terminals or leads 56 include outer portions 56c (shown in solid lines) configured into a gull-wing shape for direct connection to contact pads 37 on printed circuit board 14. The inner portions 56b of leads 56 are shaped to extend into the housing 11 by a somewhat greater distance than in the embodiment of FIGS. 1 and 2 to provide a greater amount of flexibility to the lead portions. As illustrated in dotted lines in FIG. 3, leads 56 can also be configured with flat outer lead portions 56d for socket mounting to the printed circuit board 14. These examples are for illustration purposes only and are not intended to limit the configuration of the outer portions of leads 56 to those shown.

In the embodiment of FIG. 3, protective compound 40 and cover 17 are replaced by individual caps 61, hermetically sealing each of semiconductor chips 13 from outside environment. Caps 61 can be formed of ceramic or any other suitable material and are shaped to completely surround semiconductor chips 13. Caps 61 are bonded to substrate 30 of chip carrier 12a to surround and contain the chips and protect them from the environment. When such caps are used, the interconnection means include conductor portions which extend beneath the caps as shown schematically at 62. A suitable sealing cap is illustrated and described in U.S. Pat. No. 4,426,769 incorporated by reference herein and need not be described in detail.

FIGS. 4A and 5A illustrate, in exploded and assembled cross-sectional views, respectively, another chip carrier substrate 71 which can be incorporated into the chip carrier system of the invention. Chip carrier substrate 71 comprises a rigid substrate 72, such as ceramic or another such material, having a plurality of semiconductor chips 73 mounted to a surface 74 thereof (FIG. 5A). An interconnection member 76 is provided for chip carrier substrate 71. Interconnection member 76 provides a plurality of conductive paths 77 for electrically connecting the semiconductor chips 73 to one another and to contact pads 78 (FIG. 4A) positioned adjacent the periphery of interconnection member 76. Interconnection member 76 preferably comprises a thin, flexible, plastic film or sheet 79 composed of one or more layers, having conductive paths 77 provided on the surface of the film or within the film or both on the surface and within the film conductive paths 77 may extend into the windows 80 as shown in FIG. 4A.

For example, plastic film 79 can be composed of polyimide, Teflon, or other dielectric, organic materials having, for example, a dielectric constant between 1 and 3, and preferably comprises a multi-layer film as illustrated, for example, in FIG. 4B to provide a high conductor density. In FIG. 4B, interconnection member 76 includes a multi-layer film having three dielectric layers 81, 82, and 83 separated by two, electrically conductive, foil layers 84 and 86. Each dielectric layer 81, 82, and 83 contains a plurality of conductors 87, 88, and 89, respectively, therein (shown as extending in a direction perpendicular to the plane of FIG. 4B).

Conductors 87, 88, and 89 can comprise signal-carrying conductors for carrying signals between the various semiconductor chips 73 and from chips 73 to contact pads 78. Foil layer 84 can comprise a power plane, and foil layer 86 can comprise a ground plane. Multi-layer, conductor-carrying films and their method of manufacture are known in the art and are described, for example, in U.S. Pat. No. 4,480,288 and need not be described in detail herein. Basically, the conductors can be formed by printing and etching techniques, and the individual layers can be laminated together to form the completed film. Alternately, sequential deposition of insulating or conducting layer by sputtering, vacuum deposition and plasma etching may be employed, as well as any combination of additive and subtracting process as used in producing interconnection on a semiconductor wafer.

Flexible interconnection member 76 typically has a thickness of about 6-20 mils, and each dielectric layer is about 3 mils thick. The conductors can be, for example, about 0.0005 to 0.002 inches thick and 0.001 to 0.003 inches wide, and the foil layers are about 1 mil thick. The number of layers of the film and their dimensions can, of course, be varied as required for particular applications.

Referring now specifically to the embodiment of FIG. 4A, interconnection member 76 is formed with a plurality of windows 80 through which the chips 73 extend when member 76 is positioned on substrate 74.

Interconnection member 76, comprising flexible film 79 and having conductive paths 77 and contact pads 78 on the surface thereof, is attached to surface 74 of substrate 72 at only a few (for example, four) locations as indicated at 91 in FIG. 4A by an adhesive or by any suitable mechanical attachment means. Interconnection member 76 is thus retained but is otherwise detached from surface 74 of substrate 72 over substantially its entire area, and is somewhat loosely disposed thereon (not pulled taut). Attachment of interconnection member 76 to rigid substrate 72 at only a very few locations restrains lateral movement of the interconnection member 76 relative to the substrate 72, but permits conductive paths 77 to flex and deform freely relative to substrate 72 and chips 73. In other words, with chip carrier substrate 71, the flexible, conductor-carrying interconnection member 76 is physically separate from rigid substrate 72; and any distortion or warpage of substrate 72 will not affect conductive paths 77 and will not interfere with the electrical reliability of chip carrier substrate 71. The flexibility of interconnection member 76 and conductive paths 77 allows sufficient flexing and bending to maintain reliable electrical connections on chip carrier substrate 71, notwithstanding differences in the coefficients of expansion of substrate 72 and the film.

Because conductor-carrying interconnection member 76 and substrate 72 are physically separated, substantial flexibility exists in designing chip carrier substrate 71. For example, interconnection member 76 can be designed to optimize the transmission line properties of chip carrier system 71, and substrate 72 can be designed to maximize the structural and thermal characteristics of chip carrier 71.

As shown in FIG. 5A, the terminal areas on each of semiconductor chips 73 can be electrically connected to conductive paths 77 on interconnection member 76 by wire bonds 93; and contact pads 78 (FIG. 4A) the interconnection member 76, which are formed on the surface film 79, can be directly attached to the inner portions of leads 36 or 56 as shown in FIGS. 1-3. Thus, substantially the entire length of the plurality of electrical conductors from printed circuit board 14 of FIG. 1 to semiconductor chips 73 of FIG. 4A and 5A is flexible and non-rigid, excepting only those portions 36a, 56a of the leads 36, 56 contained within the frame of the housing.

FIGS. 5B and 5C illustrate alternative embodiments of a chip carrier substrate supporting a flexible interconnection member.

In FIG. 5B, chip carrier substrate 71b comprises a ceramic substrate 101 having a plurality of cavities 102 within which the individual semiconductor chips 103 are positioned. Chips 103 can be secured to substrate 101 by, for example but not limited to, a solder applied between chips 103 and the base of cavities 102. The depth of cavities 102 is preferably slightly more than the thickness of semiconductor chips 103. In the embodiment of FIG. 5B, the terminal areas on chips 103 can be connected to the conductors on flexible interconnection member 106 by less expensive and more reliable tape-automated bonding techniques. As known to those skilled in the art, the chip terminals 107, as shown in FIG. 5B, are bonded to conductive areas on interconnection bridges 108 and to chips 103. Bridges 108 are bonded by thermo-compression bonding or AuSu "Eutectic" bonding, and all bridges 108 on a chip carrier can be bonded simultaneously as is known to those skilled in the art. Alternately, the conductive paths 77 of the interconnection members extend into windows 80 as shown in FIG. 4A, and are directly bonded to chip terminals 107 in the same manner as mentioned above. By aligning chips 103 and the conductors on interconnection member 106, the length of the interconnections, whether by wire bonds or tape-automated bonding, can be minimized to reduce the resistance of the interconnections and provide more efficient conductive pathways.

As indicated above, when two dissimilar materials are bonded together, and are subjected to change in temperature, each expands a different amount. This results in bonding of the sandwich—the so called "Bimetallic Effect". This in turn stresses the semiconductor, resulting in change of its performance, such as change in gain or linearity. Thus, the physical separation of the substrate and the interconnection member permits great flexibility in designing the chip carrier system.

For example, in FIG. 5C, chip carrier 71c comprises a substrate 111 formed of metal. Metal substrates are desirable in applications where enhanced heat transfer is needed. As shown in FIG. 5C, when a metal substrate is used, the substrate may be formed with a plurality of pedestals 112 upon which the integrated circuit chips 113 are mounted. The pedestals can be formed in the substrate by known punch-forming techniques, and are preferably of substantially the same size as the chips to be mounted thereon. Pedestals 112 permit the chips to be accurately positioned on the substrate in a simple manner. Specifically, a solder preform is positioned onto the upper surface of the pedestal; and the chip is positioned on the solder. The solder is then heated in the presence of hydrogen, causing the solder to melt. The chip will float on the surface of the solder, and surface tension automatically centers the chip on the pedestal such that when the solder hardens, the chip will be precisely positioned and soldered on the pedestal. A plurality of chips can be simultaneously positioned and soldered on their respective pedestals by this technique. Surface tension will also prevent the solder from spilling off the pedestals.

The semiconductor chips 113 can be electrically connected to conductive paths on the interconnection member 116 by wire bonds 117 or by other connecting structure, such as TAB or TAB-like means. The interconnection member 116 can be made of flexible film or some other suitable material.

It is usually desirable to apply a non-conductive insulating coating 118 to the surface of the conducive metal substrate to electrically isolate the conductors and chips from the substrate. Such a coating can be applied by well-known sputtering techniques. Coating 118 may be a thin layer of diamond deposited by methane-hydrogen method using microwaves or the acetone method or others. Diamond is an ideal heat conductor. Non-conductive spacers illustrated at 119 may be provided to space the interconnection member 116 from the substrate to approximately the level of pedestals 112 to permit a reduction in the length of the bonds 117. The spacers 119 need not be attached to either the interconnection member 116 or the substrate 111, however, such attachment may be made by any suitable means to one or the other, but not to both.

While what has been described constitute presently preferred embodiments of the invention, it should be recognized that the invention could take numerous other forms. Accordingly, it should be understood that the invention is to be limited only insofar as is required by the scope of the following claims.

What is claimed is:

1. A semiconductor chip carrier system for use with a multiple chip carrier substrate, the system comprising:
   a frame of generally rectangular shape having a first major surface, a second major surface, and walls connecting the surfaces, the first major surface having a substrate receiving area;
   the substrate, having a plurality of semiconductor chips mounted thereon, is positioned in the substrate receiving area and secured therein;
   a plurality of electrical terminals extending through one or more walls of the frame, the terminals including a central portion embedded in the wall or walls, an outer compliant portion extending outside the frame and adapted to be electrically connected to external circuitry, and an inner compliant portion which is adapted to be electrically connected to a contact pad in electrical engagement with a semiconductor chip of the multiple chip carrier substrate;
   cover means provided to protect the semiconductor chips from environmental harm;
   a flexible interconnection member having conductors, mechanically fastened to the substrate at a plurality of sites to restrict lateral movement of the interconnection member and associated conductors relative to the substrate while permitting the interconnection member and associated conductors and the substrate to flex and distort substantially independently of one another when subject to temperature variations; and
   the frame being substantially non-rigid such that as the substrate expands and contracts according to temperature variation, the non-rigid frame allows the terminals to move accordingly, thereby eliminating the harmful stresses that will otherwise occur between the substrate and the terminals.

2. A system as recited in claim 1 characterized in that a contact pad is provided at one end of each of the conductors of the flexible member, the inner portion of each terminal being adapted to contact a respective contact pad, thereby electrically connecting the conductors to the terminals.

3. A system as recited in claim 1 characterized in that the substrate comprises a metal substrate which includes a plurality of pedestals for supporting respective semiconductor chips thereon.

4. A system as recited in claim 3 characterized in that a non-conductive coating is provided on the surface of the metal substrate.

5. A system as recited in claim 4 characterized in that spacer means for spacing the flexible member from the metal substrate is disposed between the flexible member and the substrate and is in engagement with only one of said flexible member or said substrate.

6. A semiconductor chip carrier system for use with a multiple chip carrier substrate, the system comprising:
   a frame of generally rectangular shape having a first major surface, a second major surface, and walls connecting the surfaces, the first major surface having a substrate receiving area;

the substrate, having a plurality of semiconductor chips mounted thereon, is positioned in the substrate receiving area and secured therein;

a plurality of electrical terminals extending through one or more walls of the frame, the terminals including a central portion embedded in the wall or walls, an outer compliant portion extending outside the frame and adapted to be electrically connected to external circuitry, and an inner compliant portion which is adapted to be electrically connected to a contact pad in electrical engagement with a semiconductor chip of the multiple chip carrier substrate;

a cover means provided to protect the semiconductor chips from environmental harm comprising a plurality of individual cover members which are placed and hermetically sealed over each respective semiconductor chip; and the frame being substantially non-rigid such that as the substrate expands and contracts according to temperature variation, the non-rigid frame allows the terminals to move accordingly, thereby eliminating the harmful stresses that will otherwise occur between the substrate and the terminals.

* * * * *